United States Patent
Trudeau et al.

(10) Patent No.: US 7,312,604 B2
(45) Date of Patent: Dec. 25, 2007

(54) PORTABLE MANIPULATOR FOR STACKABLE SEMICONDUCTOR TEST SYSTEM

(75) Inventors: Paul Trudeau, Moutain View, CA (US); Michael Caradonna, Santa Clara, CA (US)

(73) Assignee: Nextest Systems Corporation, San Jose, CA (US)

( * ) Notice: Subject to any disclaimer, the term of this patent is extended or adjusted under 35 U.S.C. 154(b) by 92 days.

(21) Appl. No.: 11/192,631

(22) Filed: Jul. 29, 2005

(65) Prior Publication Data

US 2007/0024296 A1   Feb. 1, 2007

(51) Int. Cl.
*G01R 31/02*   (2006.01)
(52) U.S. Cl. .................... 324/158.1; 324/758
(58) Field of Classification Search ...... None
See application file for complete search history.

(56) References Cited

U.S. PATENT DOCUMENTS

| | | | |
|---|---|---|---|
| 4,527,942 A | 7/1985 | Smith | |
| 4,589,815 A | 5/1986 | Smith | |
| 4,973,015 A | 11/1990 | Beaucoup et al. | |
| 5,149,029 A | 9/1992 | Smith | |
| 5,241,870 A | 9/1993 | Holt | |
| 6,396,257 B1 | 5/2002 | Baum et al. | |
| 6,646,431 B1 | 11/2003 | Parvez et al. | |
| 6,766,996 B1 | 7/2004 | Somers | |
| 6,838,868 B1 * | 1/2005 | Bosy ........................ | 324/158.1 |
| 6,888,343 B1 * | 5/2005 | Holt et al. ............... | 324/158.1 |

* cited by examiner

*Primary Examiner*—Minh N. Tang
(74) *Attorney, Agent, or Firm*—Dorsey & Whitney LLP

(57) ABSTRACT

This invention provides a manipulator for positioning a test head relative to a prober or other reference. The manipulator has a frame; a linkage coupled to the frame and including first and second links having freedom of rotation about respective pivots and a third link coupled to the first and second links such that the third link has translational and rotational degrees of freedom of movement; and an adaptor coupled to the third link and configured to attach to a test head. The invention also provides a method of controlling the manipulator.

5 Claims, 5 Drawing Sheets

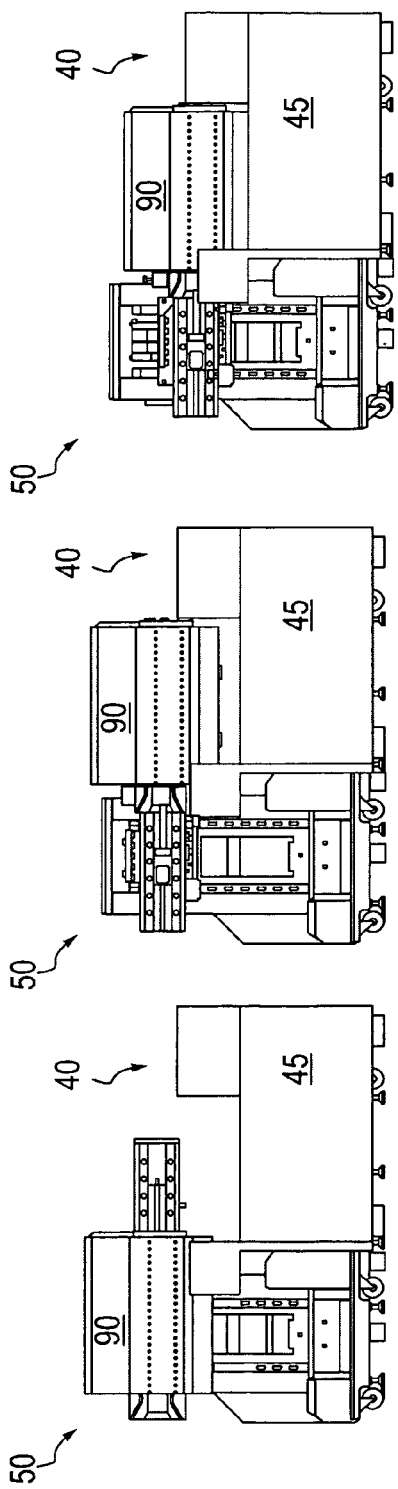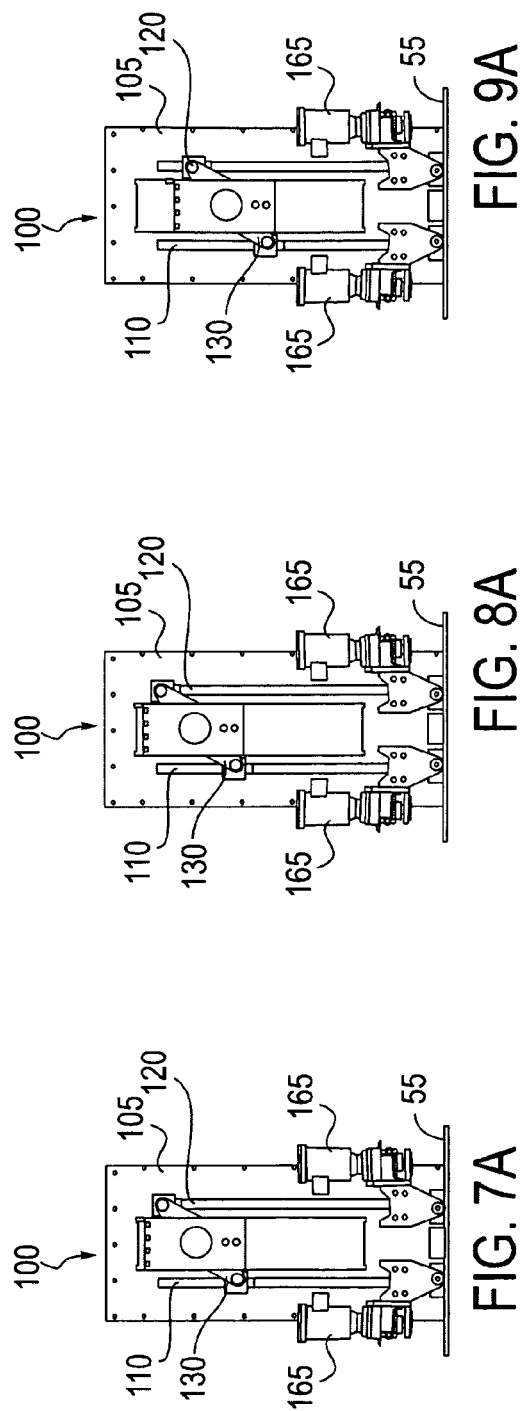

US 7,312,604 B2

PORTABLE MANIPULATOR FOR STACKABLE SEMICONDUCTOR TEST SYSTEM

FIELD OF THE INVENTION

This invention relates, in general, to manipulators for positioning modules which are unwieldy due to weight and size, and more particularly to manipulators for positioning test heads relative to other elements of an automated test system, and to methods for their use.

BACKGROUND OF THE INVENTION

Economic efficiency drives the semiconductor industry, making space, speed, and cost of ownership important factors in capital equipment design. Space is important because facilities are hyper-expensive, often costing several billion dollars to construct. Owners of such facilities increasingly desire to tightly arrange machines in order to maximize return on investment. Thus, trends in capital equipment design are toward vertically stackable systems and machines with minimal floor footprint.

Speed is important because it determines output quantity. To increase manufacturing speed, fabrication and test systems are automated and modular. In a typical test system, robotic handling machines cycle articles to and from a modular test head, which contains measurement equipment. Depending on the measurements, the test head may be in "head over," "head under," or "vertical plane" position relative to the handler. The test head as a whole can be mounted and dismounted from the rest of the system using a manipulator, enabling rapid swapping of test heads or interface elements to perform different measurements, or for test head calibration, or for maintenance.

Cost of ownership is also important. For test head manipulators, cost generally scales with degrees of freedom and weight-bearing capacity. Thus, there is a cost-flexibility tension in manipulator design, which results in known test head manipulators being classified as "dedicated" or "general purpose." Dedicated manipulators are typically fixed to another element of a test system and have customized design weight limits, size limits, and ranges of movement. Customization, however, adversely affects off-design applicability as test head weight, size, positioning or stacking requirements change. As a result, a dedicated manipulator may need time-consuming or expensive modification or replacement.

General-purpose manipulators, in comparison, are typically freestanding and have up to six degrees of freedom of movement. Design trade-offs necessary to achieve broad purposes, however, may render such manipulators as inappropriate for many applications as an off-design customized device; or may render the manipulator overly expensive.

In striking a design balance, many known general-purpose and dedicated manipulators employ hinges to support the weight of a test head while allowing rotation about the hinge's axis. Such hinged structures can bear thousands of pounds of test head weight and provide adequate freedom of movement, but disadvantageously require considerable headroom and floor space to accommodate the arc of the test head's swing. Moreover, should vertical translation be desired, other structures are needed in addition to the hinge, which increases cost.

What the semiconductor industry needs for increased space efficiency, instead, are compact, portable manipulators for translating and rotating a heavy test head into "head over," "head under," or "vertical plane" orientations, such functionality achieved with reduced floor space and headroom requirements and cost, and without customization.

BRIEF SUMMARY OF THE INVENTION

This invention provides a manipulator for positioning a test head relative to a prober or other reference. The manipulator has a frame; a linkage coupled to the frame and including first and second links having freedom of rotation about respective pivots and a third link coupled to the first and second links such that the third link has translational and rotational degrees of freedom of movement; and an adaptor coupled to the third link and configured to attach to a test head. The invention also provides a method of controlling the manipulator.

BRIEF DESCRIPTION OF THE DRAWINGS

FIG. 7 is a side view of the system of FIG. 6, after performing a further rotation of the test head.

FIG. 7A is a side view of internal structure of the manipulator, corresponding to FIG. 2, when the manipulator is in the position shown in FIG. 7.

FIG. 8 is a side view of the system of FIG. 7, after performing a horizontal translation of the test head.

FIG. 8A is a side view of internal structure of the manipulator, corresponding to FIG. 2, when the manipulator is in the position shown in FIG. 8.

FIG. 9 is a side view of the system of FIG. 8, after performing a downward vertical translation of the test head.

FIG. 9A is a side view of internal structure of the manipulator, corresponding to FIG. 2, when the manipulator is in the position shown in FIG. 9.

DETAILED DESCRIPTION OF THE INVENTION

Figure 1:
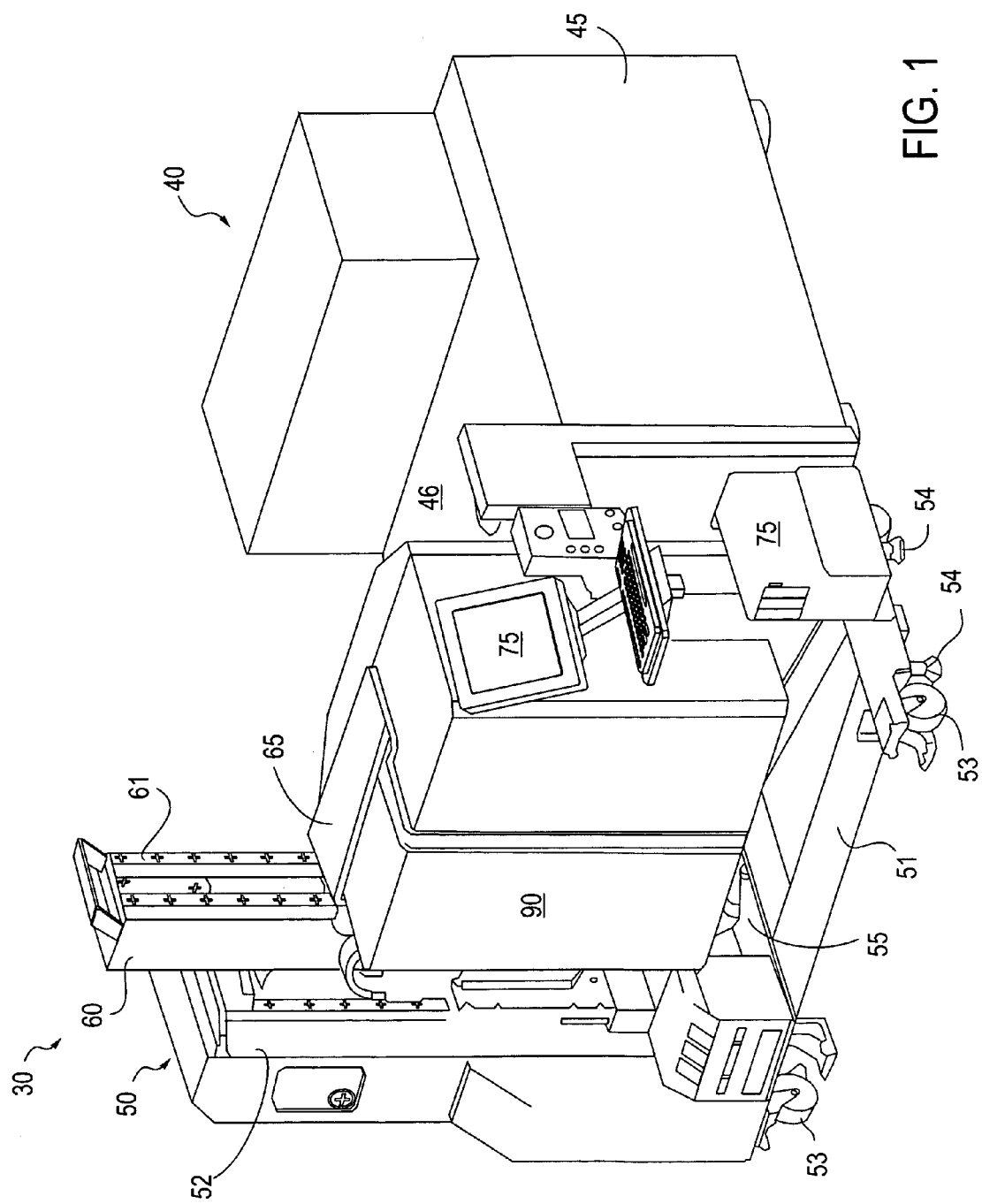
FIG. 1 is a perspective view of an automatic test system in accord with one embodiment of the present invention.

FIG. 1 is a perspective view of an automatic test system in accord with the present invention. In this embodiment, which is a teaching example of broader principles of the invention, test system 30 includes prober 40, manipulator 50 located proximal to the prober, and removable test head 90. While the test system in FIG. 1 is not a vertically stacked system for reasons of clarity, one will readily appreciate that other embodiments may be stacked.

In the exemplary embodiment of FIG. 1, prober 40 is a wafer prober. Otherwise common wafer probers typically include a robotic handling mechanism for picking wafers from a supply and gently and accurately placing the wafer relative to an interface. A test head positioned on an opposing side of the interface may conduct a variety of probing tests. Alternate embodiments replace the prober with a package handler, or other device. Many variations are in accord with the invention.

FIG. 1 shows test head 90 attached to manipulator 50 by yoke 65 and in a dismounted position relative to prober 40. For testing, however, the manipulator repositions the test head by lifting it upwardly, rotating ninety degrees, translating along guide rails 61, and lowering onto mounting surface 46 of chassis 45. Such mounting and dismounting of the test head is described in detail below and illustrated in a sequence of figures referenced elsewhere herein. Once positioned, different embodiments of the test head may be left for differing lengths of time, from minutes to days to months or years, depending on the application and circumstances of use.

In FIG. 1, prober 40, including chassis 45, is stationary on a supporting surface, or floor, of a facility. Manipulator 50, in contrast, optionally includes wheels 53 coupled to frame 51, which advantageously enables a user to move the manipulator as needed within a facility. To secure and stabilize the manipulator prior to bearing a load, the frame includes jack stands 54, which may be rotated to extend downwardly to contact the floor and lift the manipulator upwardly until the wheels are no longer in contact with the floor. Many other movement and stabilization means such as rollers or skids or air cushions are in accord with the invention, as is the option of a fixed manipulator.

Once mounted on chassis 45, test articles may be conveyed to and from test head 90 by various and otherwise conventional conveyance means. The embodiment in FIG. 1 includes robotic conveyance means within prober 40, which are not shown for reasons of clarity. Typical conveyance means include pick and place wafer handlers or robots, which pick a wafer from a boat of wafers and place the wafer in a predetermined test position. Many other conveyance means are in accord with the principles of the present invention.

Test head 90 is a removable module, which is advantageous in enabling rapid swapping. Should a modular test head need replacement or service for any reason, it may be removed quickly. While preferred embodiments of the invention manipulate test heads, manipulating other modules that are unwieldy due to weight and size is also within the broad principles of the invention.

Test head 90 typically contains measurement equipment for testing articles in a manufacturing process. The test head may contain equipment for evaluating electronic devices on semiconductor wafers, circuit boards and the like. Equally, the test head may include equipment for optical diagnostics of surfaces or structures on a test article. In other embodiments, the test head may include equipment for mechanical testing, such as surface profiling with a stylus. Thus, the test head may couple with a test article in a wide variety of manners, depending on whether the test diagnostic is based on mechanical or electrical or magnetic or optical, or other scientific principles.

In one preferred embodiment, test head 90 is an electronic tester for testing electronics formed on a semiconductor wafer. Once mounted on mounting surface 46 of prober 40, pins extend downwardly from a portion of the test head. To conduct a test, conveyance means within the prober bring a test wafer upward towards the downwardly extending pins. Thus, structures on the wafer are precisely and gently brought into mechanical contact with pins of the test head in order to conduct electronic tests. See, for example, U.S. Pat. No. 7,098,650, entitled "Apparatus for Planarizing a Probe Card and Method for Using Same" issued Aug. 29, 2006, the entire contents of which is incorporated herein by this reference.

Many other test head-test article configurations are possible in accord with the invention. For example, instead of the "head over" configuration described above, the test head may in a "vertical plane" orientation, in which conveyance means move test articles to a side-facing portion of the test head. Alternate embodiments enable the test head to be in a "head under" configuration in which conveyance means lower test articles toward a top portion of the test head.

Equally, the test head may in a "vertical plane" orientation, in which conveyance means move test articles to a side-facing vertical portion of the test head.

FIG. 1 also shows control system 75, including a digital computer processor coupled to position and inclination sensors (See FIG. 2), which control manipulator 50 and thus the positioning of test head 90. Typically, the digital computer processor is part of an otherwise common desktop computer. FIG. 1 shows an external mounting arrangement. A range of alternate embodiments, however, has the computer processor in a "single board" arrangement, where the single board is mounted internally. That is, within the manipulator. An advantage of such a "single board" is that it saves space compared to a desktop computer mounted externally, as in FIG. 1. A keypad or keyboard and a monitor, such as a CRT or LCD screen, are mounted externally, and included in control system 75.

Control system 75 is preferably a digital, or a mixed analog/digital, control system. Other embodiments of manipulator 50, however, have entirely analog electromechanical control systems. Still other embodiments have no control system and are hand-operated. Preferably, though not necessarily, the control system is also configured to control the conveyance of test articles to and from the test head by conveyance means (not shown) and testing by the test head.

Figure 2:
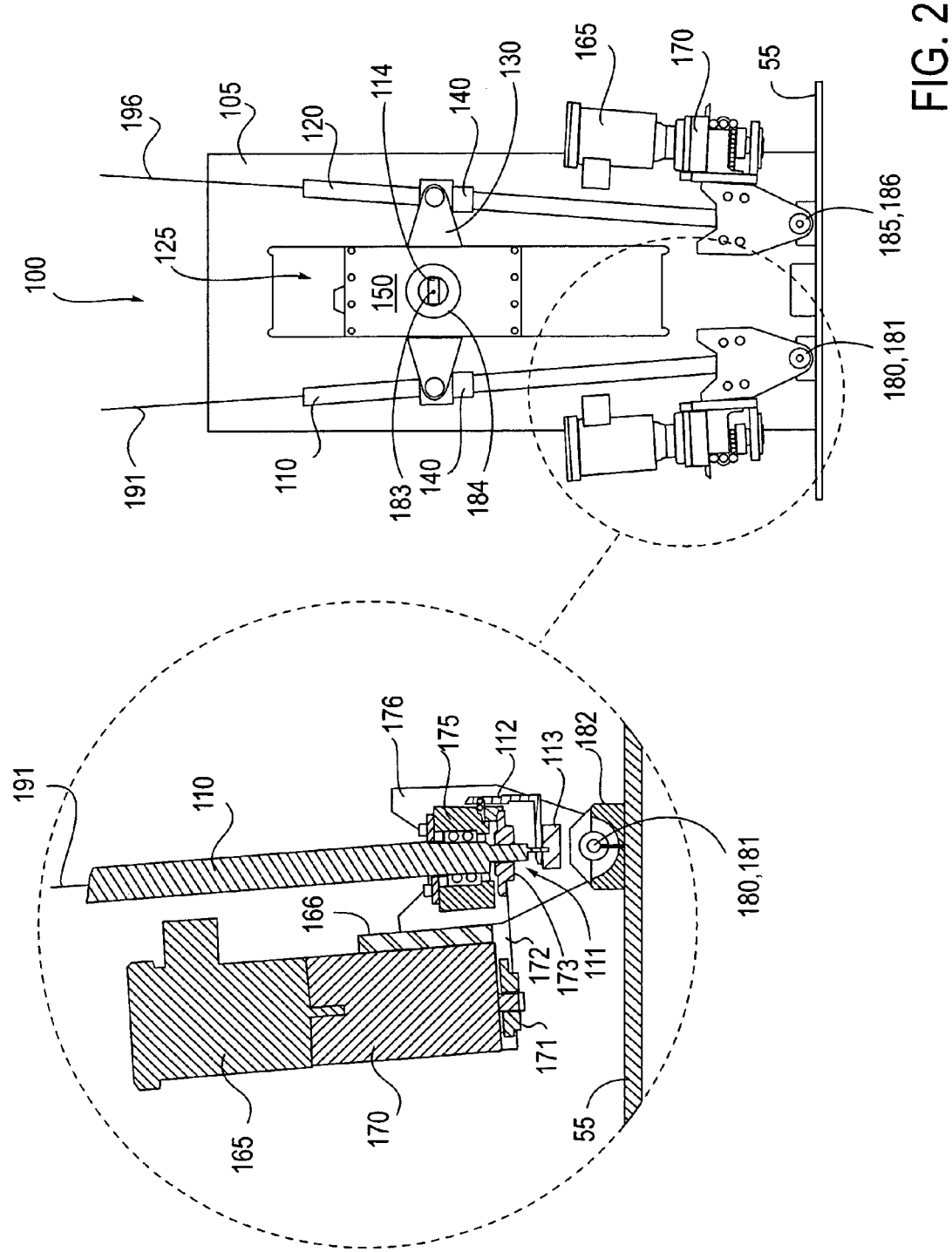
FIG. 2 is a side view, with a cross-sectional detail portion, of the internal structure of the manipulator shown in FIG. 1.

FIG. 2 is a side view, with a cross-sectional detail portion, of internal structure of the manipulator shown in FIG. 1. In contrast to the illustration of FIG. 1, the illustration of FIG. 2 omits test head 90, cover 52, arm 60, yoke 65, and portions of frame 51 to show internal structure of manipulator 50. This embodiment, as in FIG. 1, is a teaching example. Many variations from what FIG. 2 shows are possible in accord with the invention.

According to a broad principle of the invention, manipulator 50 includes a multi-link linkage 100. Coupled links of the linkage enable space-efficient test head movement by bearing the weight of the test head while rotating the test head about an axis passing through the test head, in contrast to a hinge axis passing outside of the test head. Compared to the wide swinging arcs of a hinge manipulator, preferred embodiments of the present invention enable a test head to be "tumbled" within a reduced footprint about the size of the test head shadow. Also, preferred embodiments of the present invention enable one structure to affect motion in two degrees of freedom, translation and rotation. This gives a cost advantage in comparison to manipulators that have separate hardware for each degree of freedom of movement.

In FIG. 2, linkage 100 includes first and second links 110 and 120, respectively, which are elongate lead screws. The first and second lead screws each respectively have extremity 111, which is rotatably supported by bearing assembly 175. Accordingly, the first and second lead screws have freedom of rotation about respective first and second axes of rotation 191 and 196, which axes correspond to respective longitudinal axes through the lead screws. Moreover, as described below, the lead screws' threads may bear weight and may drive a lead nut to actuate other elements.

First and second links 110 and 120 are pivotably coupled to bottom plate 55, which is in turn attached to frame 51 (See FIG. 1). Bearing assemblies 175 are supported between flanges 176. The flanges couple to pivot blocks 182 by a shaft and bearing assembly, which passes through holes in the flanges and pivot blocks. Accordingly, the first and second lead screws have freedom of rotation about respective first and second pivot 180 and 185, and corresponding pivot axes 181 and 186. The pivot and rotation axes of the respective lead screws are perpendicular to each other.

Linkage 100 further includes third, or cross, link 130. In the embodiment of FIG. 2, lead nuts 140 thread onto first and second lead screws 110 and 120, respectively. The lead nuts, in turn, are pivotably attached to opposite ends of the third link by otherwise usual and customary means. Accordingly, the third, or cross, link has freedom of movement along the lengths of the elongate first and second links. If opposite ends of the third link travel at the same velocity along the first and second links, then the third link will translate and not rotate. If, on the other hand, opposite ends of the third link travel at different velocities along the first and second links, then the third link will rotate about third pivot 183.

In contrast to pivots 180 and 185 of the first and second links 110 and 120, respectively, third pivot 183 is not fixed relative to bottom plate 55 or the first and second links, and may translate along with the third link.

A range of alternate embodiments replace the above-described lead screw and lead nut arrangement, with its sliding metal-to-metal contact between lead nut and lead screw threads, with a low friction arrangement wherein screw threads on first and second links 110 and 120 engage rolling elements such as, for example, balls or cylindrical rollers. Comparatively lower friction lends an advantage in that less torque is required to actuate the links, resulting in smaller and less expensive drive trains. On the other hand, comparatively lower friction implementations, such as those employing ball screws, may result in "backdrive," or slippage, when torque is removed from the first and second links. Accordingly, preferred embodiments in this range may include a brake or other braking means, or an anti-backdrive mechanism or other anti-backdrive means.

In a typical embodiment, linkage 100 is coupled to an actuator. Other embodiments, however, may be hand-actuated. Most preferably, the first and second links are coupled to two independent actuators, or a single actuator whose power may be split. Independent actuation of different portions of the linkage advantageously improves stability and control.

In FIG. 2, the actuators are two independent electric motors 165, which couple to a chain and sprocket drive train. Each of the first and second lead screws is attached to respective link sprockets 173. Chain 172 couples the link sprocket to drive sprocket 171, which is attached to gearbox 170. The gearbox is further attached to mounting plate 166. The electric motor fastens to the gearbox.

In alternate embodiments, the actuator may operate on mechanical or electro-magnetic or other principles to deliver power to the linkage. Electric motors, and pneumatic or hydraulic pistons are examples of actuators. Many variations are possible in accord with the invention.

Preferred embodiments of linkage 100 optionally include stiffening means to improve rigidity in bending or torsion, or both. Stiffening is advantageous in the case of usage with heavy test heads 90 (See FIG. 1). With test heads commonly weighing thousands of pounds, excessive static or dynamic deflections could lead to failure of the linkage.

In FIG. 2, a portion of bottom plate 55 between first and second pivots 180 and 185, respectively, acts as a rigid, fixed link. Further, vertical plate 105 includes slot 125, which is an elongated or substantially rectangular aperture in the vertical plate. Box 150 is located within the constraint of the slot and connects to a guide wheel and rail system (not shown). The box includes third bearing assembly 184 to accommodate the rotation of third link 130 relative to the box. Further, the bottom plate and vertical plate are rigidly attached to each other. As such, the box and vertical plate advantageously provide rigidity in bending or torsion for heavy test heads 90.

Because linkage 100 has multiple links and multiple degrees of freedom of movement, preferred embodiments of manipulator 50 optionally include a system for controlling actuation of the linkage. A digital control system including a computer processor is most preferred, although alternate embodiments include analog control systems, or hand-control hardware.

In FIG. 2, brackets 112 hold encoders 113, which are sensitive to rotation of first and second lead screws 110 and 120 about respective rotational axes 191 and 196. Preferably, the encoders count partial turns. Less accurate embodiments may count only full turns. An optional inclinometer 114 is attached to third link 130, typically near third pivot 183. As described in detail below, such encoders and optional inclinometer enable control system 75 (See FIG. 1) to determine the location, speed, and angular orientation of the third link. Embodiments which do not include an inclinometer may determine an angle or inclination based on encoder values. The encoders and inclinometer communicate with a computer processor, which is also in communication with motors 165. With data from sensors such as the encoders and inclinometer, a computer can execute feedback control algorithms to control the linkage's motion.

In operation, motors 165 drive respective first and second lead screws 110 and 120 through sprockets 171 and 173, and chains 172. The lead screws may each rotate either clockwise or counterclockwise about respective first and second axes of rotation 191 and 190. The threads of the lead screws support the weight of the third link (and attached test head 90). To translate the third link vertically, the motors drive opposite ends of the third link to travel at equal speed along the lead screws. To rotate the third link, the motors drive the opposite ends of the third link at different velocities. The velocities may differ by virtue of different speeds along respective links or different directions along the links. Moving at different velocities, the opposite ends of the third link will rotate relative to third pivot 183 while the third pivot remains fixed or translates vertically. As the third link pivots, the first and second links accommodate the change by rotating at first and second pivots 180 and 185, respectively.

To manipulate a test head or other object, third link 130 (See FIG. 2) attaches to an adapter, which in turn attaches to the test head. Preferred embodiments include an extendable adapter. Other embodiments, however, include a non-extendable adapter.

Figure 3:
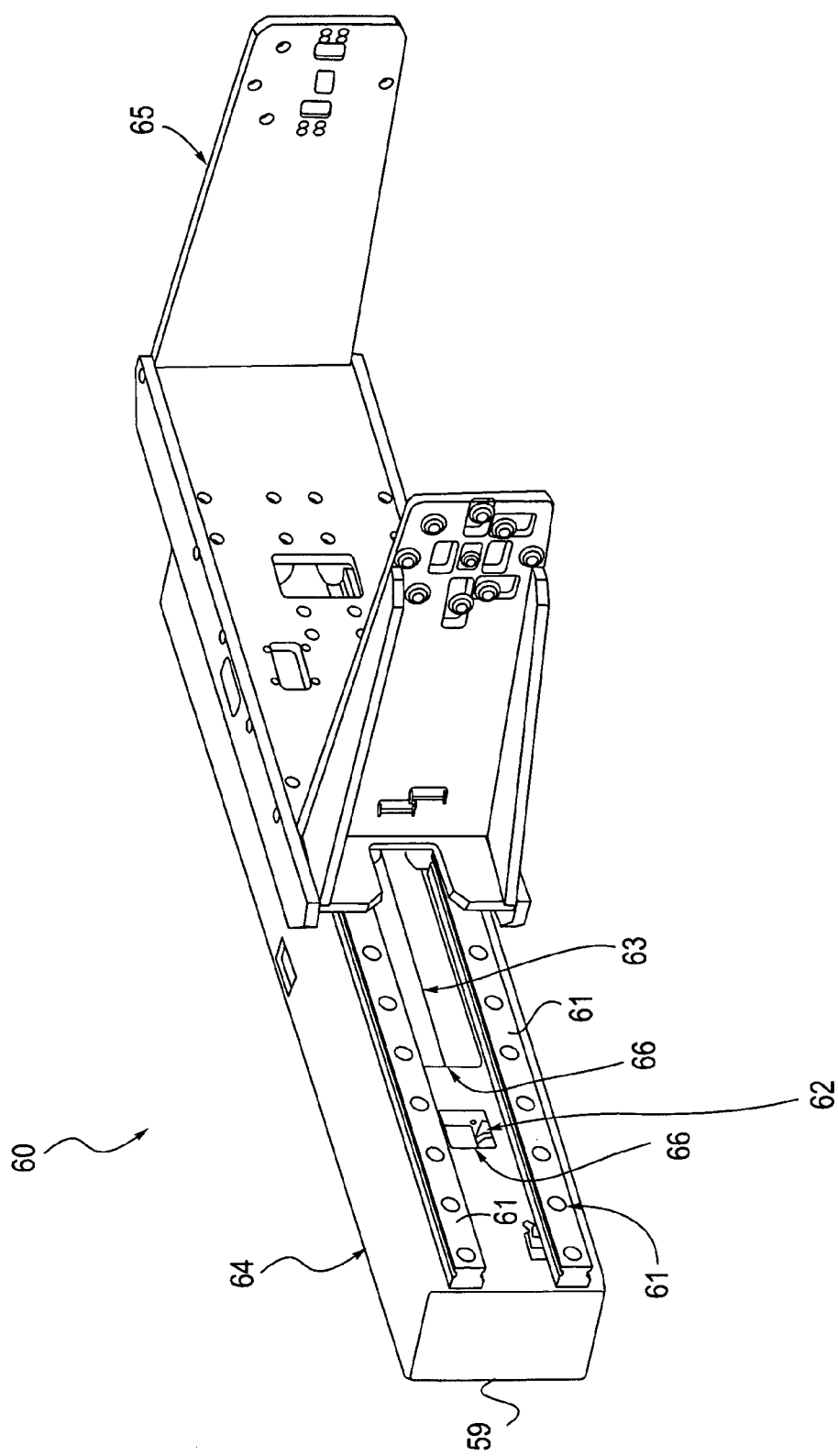
FIG. 3 is a perspective view of the arm of the manipulator shown in FIG. 1.

FIG. 3 is a perspective view of the arm of the manipulator shown in FIG. 1. Arm 60 includes box beam 64. Side 59 of the box beam rigidly attaches to third link 130 (See FIG. 2) near pivot 183 by usual and conventional means such as mechanical fasteners. Rigidly attached to the third link, the arm rotates and translates with the third link.

Arm 60 is an extendible adapter, which includes a pair of arm guide rails 61 attached to box beam 64. Yoke 65, which is formed and dimensioned to receive and fasten to test head 90 (See FIG. 1), rides the guide rails on attached guide wheels (not shown).

Arm motor 62 is located within box beam 64. Arm lead screw 64 and a lead nut (not shown) threaded on the lead screw and coupled to yoke 60 form a translation mechanism to move the yoke in either of opposite first and second directions along guide rails 61. Preferred embodiments include access ports 66 for reaching the arm motor, arm lead screw and lead nut.

Because horizontal translation along guide rails 61 requires comparatively little force, a range of alternative embodiments of arm 60 include a simple handle for manual translation. Other ranges of embodiments include pressurized actuators, such as pneumatic or hydraulic actuators, instead of a motorized lead screw and lead nut arrangement. Many other alternatives are possible in accord with the invention.

Turning now to an example of functionality, FIGS. 4-9 show side views of the system of FIG. 1 as an exemplary test head mounting operation progresses. FIGS. 4A-9A show side views of the internal structure of the manipulator when the manipulator is in positions shown in FIGS. 4-9, respectively. The structure shown in FIGS. 4A-9A corresponds to the structure shown in FIG. 2.

Figure 4:
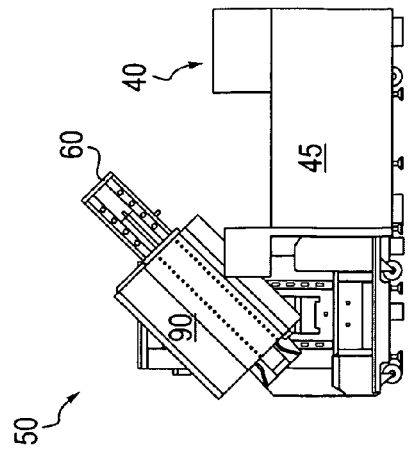
FIG. 4 is a side view of the system of FIG. 1, showing a first, or service, position in a sequence of positions for mounting a test head onto a prober.
Figure 4A:
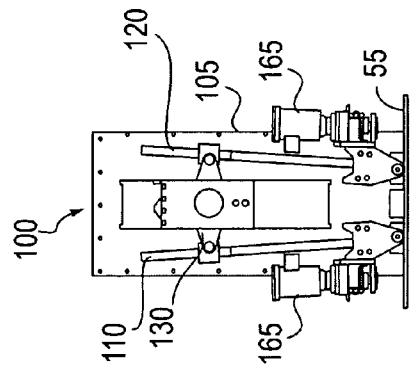
FIG. 4A is a side view of internal structure of the manipulator, corresponding to FIG. 2, when the manipulator is in the position shown in FIG. 4.

In FIG. 4, test head 90 is dismounted from prober 40, in a "service" position. FIG. 4A shows the position of linkage 100 in the service position. Going forward in a sequence of motions, manipulator 50 translates and rotates the test head to a final mounted, or "docked," position on the prober.

Figure 5:
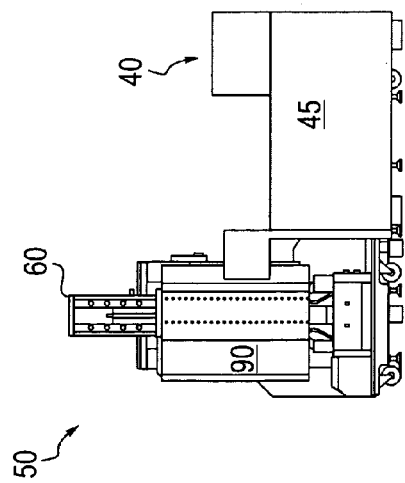
FIG. 5 is a side view of the system of FIG. 4, after performing an upward vertical translation of the test head.
Figure 5A:
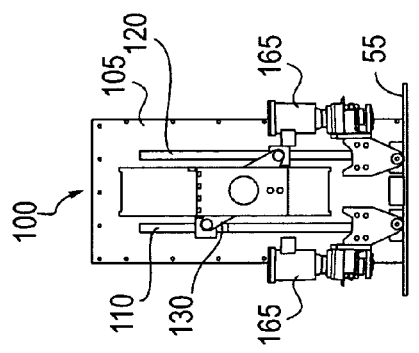
FIG. 5A is a side view of internal structure of the manipulator, corresponding to FIG. 2, when the manipulator is in the position shown in FIG. 5.

In a first control step, illustrated by corresponding FIG. 5 and FIG. 5A, a user toggles a switch or other device and control system 75 (See FIG. 1) initiates a vertical translation of third link 130 by driving first and second lead screws 110 and 120 synchronously. As the first and second lead screws rotate, opposite ends of the third link travel along respective lead screws at the same velocity. Thus, there is no rotation of the third link. Arm 60 and test head 90 translate vertically because each is attached to the third link. Usual and customary sensors such as encoders, which count turns or partial turns, coupled to the lead screws provide feedback to determine distance along the lead screws and thus height based on the know threading of the lead screws. This motion continues until the third link reaches a predetermined "rotation height."

Figure 6:
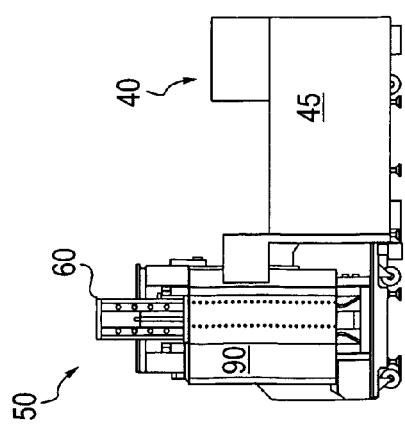
FIG. 6 is a side view of the system of FIG. 5, after performing a rotation of the test head.
Figure 6A:
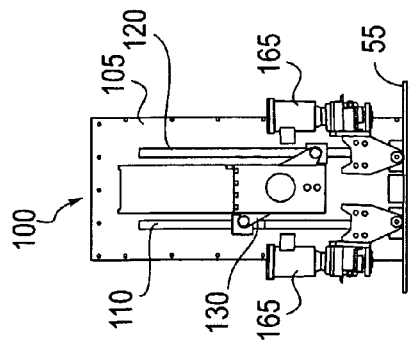
FIG. 6A is a side view of internal structure of the manipulator, corresponding to FIG. 2, when the manipulator is in the position shown in FIG. 6.

In a second step, illustrated by corresponding FIG. 6 and FIG. 6A, third link 130 rotates; which in turn rotates arm 60 and test head 90. To accomplish the rotation, control system 75 drives opposite ends of third link 130 at different velocities. Preferably, first lead screw 110 stops rotating as second lead screw 120 continues to rotate. Alternatively, the first lead screw may slow to a non-zero rotational speed, or reverse its sense of rotation. As the third link rotates about third pivot 183, the first and second lead screws pivot about first and second pivots 180 and 185, respectively. This rotational motion continues until the third link reaches a predetermined inclination, for example the one in FIG. 6A, which results in a forty-five degree test head rotation as shown in FIG. 6.

During the rotational motion described above, usual and customary sensors such as encoders 113 coupled to linkage 100 provide feedback to determine inclination. An optional inclinometer 114, which may be comparatively less precise than the encoders, typically provides an initial reference inclination with respect to Earth's gravity. Once initialized with the inclinometer or otherwise, control system 75 stores encoder "counts" (rotation quanta). With the encoder counts, the control system determines inclination given the known threading of the lead screws. Because the encoder counts are typically small fractions of a turn, a predetermined inclination (equally, a predetermined vertical position) may be achieved with great precision and repeatability.

In an optional third step, illustrated by corresponding FIG. 7 and FIG. 7A, third link 130 translates vertically; which in turn vertically translates arm 60 and test head 90. To accomplish the translation, control system 75 drives first and second lead screws synchronously, as in the first step described above. This motion continues until the third link reaches a predetermined position above prober 40.

In an optional fourth step, the inclination of third link 130 may be fine-tuned or corrected by rotation as in the second step described above.

In a fifth step, illustrated by corresponding FIG. 8 and FIG. 8A third link 130 remains fixed and arm 60 extends to translate test head 90 horizontally. To accomplish the translation, control system 75 energizes arm motor 62 to drive arm lead screw 63, which translates yoke 65 along guide rails 61 (See FIG. 3). Usual and customary sensors such as an encoder coupled the arm lead screw provide feedback to determine the actual position over the prober. This motion continues until the yoke, and thus the attached test head, reaches a predetermined position above prober 40.

In sixth step, illustrated by corresponding FIG. 9 and FIG. 9A, third link 130 translates vertically downward; which in turn vertically translates arm 60 and test head 90 downward. To accomplish the translation, control system 75 drives first and second lead screws synchronously, as in the first step described above with the exception that the sense of rotation is reversed. This motion continues until the third link reaches a predetermined position above prober 40 in which the test head is in a mounted or "docked" position relative to the prober.

To dismount or "de-dock" test head 90 from prober 40 and return to the "service" position, a user toggles a switch and control system 75 (See FIG. 1) initiates the reverse of the steps above. One may omit the fourth step of inclination correction even if the optional step is included in the docking sequence.

Thus, manipulator 50 brings test head 90 from a "service" position to a "docked" position, or vice versa, with a minimal amount of headroom and floor footprint. Linkage 100 (See FIG. 2) enables this space-efficient test head movement by bearing the weight of the test head while rotating the test head about an axis passing through the test head, in contrast to a hinge axis passing outside of the test head. Compared to the wide swinging arcs of a hinge manipulator, preferred embodiments of the present invention enable a test head to be "tumbled," as shown by the illustrations of FIGS. 4-9, within a reduced footprint about the size of the test head shadow. As one will appreciate, vertical translation and tight tumbling motions are especially advantageous for vertically stacked systems.

Further, manipulator 50 enables one structure to affect motion in two degrees of freedom, translation and rotation.

This gives a cost advantage in comparison to manipulators that have separate hardware for each degree of freedom of movement.

Moreover, with control system 75, a user may accomplish the complex motion described above with a touch of a button. This is advantageous over many know manipulators, which typically have only on/off actuator operation.

Turning now to control methods, many control algorithms or techniques are in accord with the invention. For example, one technique to control the lead screws 110 and 120 (See FIG. 2) is to input a desired number of lead screw rotations (which relates to position because the length and thread count of the lead screws are known), and implement a control loop to drive the lead screws until the desired number of turns is accomplished to within a predetermined tolerance. Once the desired number of turns is within the predetermined tolerance, the lead screws stop.

Within an exemplary control loop, a nominal speed of rotation of the lead screws is determined as a sum of two terms. One term relates to the turns yet to be made to arrive at the desired number of turns. This term is at its largest at the beginning of a driving sequence and decreases as the number of turns yet to be made decreases. For faster approach to the desired number of turns, a second term relates to a sum over positions of turns yet to be made from each position onward. This second term is at its smallest at the beginning of a driving sequence, and increases because it is a sum over the driving sequence. In different embodiments, the terms may be linear or non-linear: many variations are in accord with the invention.

For synchronous rotation, control system 75 drives both first and second lead screws 110 and 120 at the nominal speed. To achieve the nominal speed, inputs to motors 165 (See FIG. 2) are determined within the exemplary control loop by expressing the motor inputs as a sum of three terms. A first term corresponds to motor input for the nominal speed, above. In a manner similar to the expression for nominal speed, a second term relates to a difference between turns of the first and second lead screws, and a third term relates to a sum over positions of differences between turns of the first and second lead screws. Thus, when there is a speed difference between the first and second lead screws, corresponding second terms and third terms provide correction toward equal speed.

For asynchronous rotation, control system 75 drives first and second lead screws 110 and 120 at different speeds. As with the nominal speed and motor inputs, an exemplary control algorithm may include a loop over turns of the lead screws with motor inputs determined from a sum of terms with differing trends.

To lend additional advantage in terms of cost of ownership, a range of preferred embodiments of manipulator 50 include encoders that may lose the number of turns if there is a power interruption. Such encoders are comparatively less expensive than absolute encoders, which preserve the number of turns despite power interruption. In these embodiments, control system 75 may execute an algorithm with input from position sensors to find a reference position, or "home," at which the encoders may be reset.

In an exemplary embodiment, control system 75 executes a "home" algorithm by first actuating lead screws 110 and 120 synchronously to translate test head 90 until a vertical "home" sensor is triggered. Second, the control system establishes the inclination of the test head in a predetermined inclination at vertical "home" by asynchronously actuating the lead screws, followed by readjusting the vertical position as in the first step, above. Third, the control system actuates arm motor 62 until yoke 65 reaches one extremity of travel or another on guide rails 61, and then brings the yoke to a "home" of travel along the guide rails. Then, the control system resets an encoder coupled to arm lead screw 63. Fourth, the control system actuates the arm motor to bring the yolk to a "service" position on the guide rail. Fifth, the control system synchronously actuates the first and second lead screws to lower the test head slightly. Sixth, the control system establishes the inclination of the test head to high accuracy by asynchronous actuation of the lead screws. Finally, the control system synchronously actuates the lead screws until a vertical "home" sensor is triggered. Then, the control system resets the encoders that are coupled to the first and second lead screws.

I claim as my invention:

1. An apparatus for positioning a test head relative to a prober, comprising a frame, first and second elongate lead screws, each of the lead screws having an extremity pivotably coupled to the frame, the first lead screw pivotable about a first pivot axis and the second lead screw pivotable about a second pivot axis extending parallel to the first pivot axis, the first and second lead screws rotatable about respective first and second axes of rotation, the first axis of rotation extending perpendicular to the first pivot axis and the second axis of rotation extending perpendicular to the second pivot axis, a link having a first end portion rotatably coupled to the first lead screw and a second end portion rotatably coupled to the second lead screw, at least one actuator coupled to the first and second lead screws for rotating the first lead screw in opposite first and second directions about the first axis of rotation and for rotating the second lead screw in opposite first and second directions about the second axis of rotation and an arm coupled to the link and adapted to carry the test head wherein rotation of the first and second lead screws in the first direction causes the link to translate relative to the first and second lead screws so as to translate the test head relative to the frame and rotation of the first lead screw in the first direction and rotation of the second lead screw in the second direction causes the link to rotate relative to the first and second lead screws so as to pivot the test head relative to the frame.

2. The apparatus of claim 1 wherein the at least one actuator includes a first actuator coupled the first lead screw and a second actuator coupled to the second lead screw.

3. The apparatus of claim 1 wherein the arm includes a translation mechanism for moving the test head in opposite first and second directions along the arm.

4. The apparatus of claim 3 wherein the translation mechanism includes a linear guide rail.

5. The apparatus of claim 1 wherein the lead screws are rolling element screws.

* * * * *